US007394942B2

(12) United States Patent
Chen et al.

(10) Patent No.: US 7,394,942 B2
(45) Date of Patent: Jul. 1, 2008

(54) VARIABLE LENGTH CODING METHOD AND APPARATUS FOR VIDEO COMPRESSION

(75) Inventors: Wen-hsiung Chen, Sunnyvale, CA (US); Fang Wu, San Jose, CA (US); Gregory D. Pelton, Raleigh, NC (US)

(73) Assignee: Cisco Technology, Inc., San Jose, CA (US)

( * ) Notice: Subject to any disclaimer, the term of this patent is extended or adjusted under 35 U.S.C. 154(b) by 95 days.

(21) Appl. No.: 11/620,167

(22) Filed: Jan. 5, 2007

(65) Prior Publication Data

US 2007/0104381 A1 May 10, 2007

Related U.S. Application Data

(63) Continuation of application No. 10/439,536, filed on May 16, 2003, now Pat. No. 7,194,137.

(51) Int. Cl.
*G06K 9/36* (2006.01)
*G06K 9/46* (2006.01)

(52) U.S. Cl. ....................................... 382/246; 382/245

(58) Field of Classification Search ......... 382/244–247; 341/65–67; 358/426.01, 426.16
See application file for complete search history.

(56) References Cited

U.S. PATENT DOCUMENTS 4,698,672 A 10/1987 Chen et al. .................. 358/136
4,706,265 A 11/1987 Furukawa .................. 375/122
4,813,056 A 3/1989 Fedele ......................... 375/27

(Continued)

FOREIGN PATENT DOCUMENTS

EP 0 266 049 A2 5/1988

(Continued)

OTHER PUBLICATIONS

G. Cote, B. Erol, M. Gallant, & F. Kossentini, "H.263+: Video Coding at Low Bit Rate" in *IEEE Transactions on Circuits and Systems for Video Technology*, vol. 8, No. 7, Nov. 1998.

(Continued)

*Primary Examiner*—Vikkram Bali
(74) *Attorney, Agent, or Firm*—Dov Rosenfeld; Inventek

(57) ABSTRACT

A method and an apparatus to encode a series of quantized coefficients of a transform of a block of image data. The method includes forming modes for each encountered non-zero amplitude and forming events for the modes in the mode-modified series formed by setting to zero all non-zero amplitudes other than the amplitude defining the mode. An event for modes for amplitudes greater than 1 is a run of none or more zero-valued coefficients followed a non-zero amplitude in the mode-modified series. A first mode is defined for amplitude 1 wherein an event is a run of none or more zero-valued coefficients followed the amplitude 1 coefficient in the mode-modified series. In another embodiment, a first mode is defined for amplitude 1 wherein an event is a run in the mode-modified series of none or more zero-valued coefficients followed by a run of one of a predefined set of sequences, each sequence in the set being a sequence of l's and 0's starting with a coefficient of amplitude 1.

16 Claims, 4 Drawing Sheets

U.S. PATENT DOCUMENTS

| | | | | |
|---|---|---|---|---|
| 4,821,119 | A | 4/1989 | Gharavi | 375/240.16 |
| 4,845,560 | A | 7/1989 | Kondo et al. | 358/133 |
| 4,858,017 | A | 8/1989 | Torbey | 358/426 |
| 4,920,426 | A | 4/1990 | Hatori et al. | 358/433 |
| 4,922,510 | A | 5/1990 | Brusewitz | 375/122 |
| 4,937,573 | A | 6/1990 | Silvio et al. | 341/67 |
| 4,985,700 | A | 1/1991 | Mikami | 341/59 |
| 4,985,766 | A | 1/1991 | Morrison et al. | 358/133 |
| 5,006,930 | A | 4/1991 | Stroppiana et al. | 358/133 |
| 5,045,938 | A | 9/1991 | Sugiyama | 358/133 |
| 5,062,152 | A | 10/1991 | Faulkner | 359/185 |
| 5,086,488 | A | 2/1992 | Kato et al. | 382/56 |
| 5,128,758 | A | 7/1992 | Azadegan et al. | 358/133 |
| 5,136,376 | A | 8/1992 | Yagasaki et al. | 358/133 |
| 5,162,795 | A | 11/1992 | Shirota | 341/67 |
| 5,166,684 | A | 11/1992 | Juri et al. | 341/67 |
| 5,179,442 | A | 1/1993 | Azadegan et al. | 358/133 |
| 5,226,082 | A | 7/1993 | Kustka | 380/46 |
| 5,253,053 | A | 10/1993 | Chu et al. | 358/133 |
| 5,253,055 | A | 10/1993 | Civanlar et al. | 358/133 |
| 5,291,282 | A | 3/1994 | Nakagawa et al. | 348/384 |
| 5,298,991 | A | 3/1994 | Yagasaki et al. | 348/416 |
| 5,301,032 | A | 4/1994 | Hong et al. | 358/261.2 |
| 5,307,163 | A | 4/1994 | Hatano et al. | 348/415 |
| 5,319,457 | A | 6/1994 | Nakahashi et al. | 348/387 |
| 5,337,087 | A | 8/1994 | Mishima | 348/405 |
| 5,363,097 | A | 11/1994 | Jan | 341/67 |
| 5,371,811 | A | 12/1994 | Morrison et al. | 382/56 |
| 5,400,075 | A | 3/1995 | Savatier | 348/384 |
| 5,402,244 | A | 3/1995 | Kim | 358/261.2 |
| 5,446,744 | A | 8/1995 | Nagasawa et al. | 371/37.4 |
| RE35,093 | E | 11/1995 | Wang et al. | 348/413 |
| 5,475,501 | A | 12/1995 | Yagasaki | 358/426 |
| 5,479,527 | A | 12/1995 | Chen | 382/232 |
| 5,488,367 | A | 1/1996 | Kitamura | 341/106 |
| 5,488,418 | A | 1/1996 | Mishima et al. | 348/398 |
| 5,488,616 | A | 1/1996 | Takishima et al. | 371/30 |
| 5,491,480 | A | 2/1996 | Jan et al. | 341/67 |
| 5,521,718 | A | 5/1996 | Eschbach | 382/233 |
| 5,528,628 | A | 6/1996 | Park et al. | 375/240 |
| 5,539,401 | A | 7/1996 | Kumaki et al. | 341/67 |
| 5,640,420 | A | 6/1997 | Jung | 375/240 |
| 5,642,115 | A | 6/1997 | Chen | 341/67 |
| 5,644,305 | A | 7/1997 | Inoue et al. | 341/67 |
| 5,647,049 | A | 7/1997 | Odaka et al. | 386/124 |
| 5,648,774 | A | 7/1997 | Hsieh | 341/67 |
| 5,650,782 | A | 7/1997 | Kim | 341/67 |
| 5,696,558 | A | 12/1997 | Tsukamoto | 348/405 |
| 5,717,394 | A | 2/1998 | Schwartz et al. | 341/51 |
| 5,731,836 | A | 3/1998 | Lee | 348/402 |
| 5,740,283 | A | 4/1998 | Meeker | 382/248 |
| 5,751,232 | A | 5/1998 | Inoue et al. | 341/63 |
| 5,767,800 | A | 6/1998 | Machida et al. | 341/67 |
| 5,767,908 | A | 6/1998 | Choi | 348/403 |
| 5,774,594 | A | 6/1998 | Kitamura | 382/239 |
| 5,793,432 | A | 8/1998 | Mishima et al. | 348/423 |
| 5,793,897 | A | 8/1998 | Jo et al. | 382/246 |
| 5,818,877 | A | 10/1998 | Tsai et al. | 375/241 |
| 5,822,463 | A | 10/1998 | Yokose et al. | 382/251 |
| 5,832,130 | A | 11/1998 | Kim | 382/248 |
| 5,844,611 | A | 12/1998 | Hamano et al. | 348/403 |
| 5,852,469 | A | 12/1998 | Nagai et al. | 348/384 |
| 5,883,589 | A | 3/1999 | Takishima et al. | 341/67 |
| 5,923,813 | A | 7/1999 | Okamoto et al. | 386/109 |
| 5,956,153 | A | 9/1999 | Hirabayashi | 358/433 |
| 5,982,437 | A | 11/1999 | Okazaki et al. | 348/413 |
| 5,999,111 | A | 12/1999 | Park et al. | 341/67 |
| 6,014,095 | A | 1/2000 | Yokoyama | 341/67 |
| 6,104,754 | A | 8/2000 | Chujoh et al. | 375/240 |
| 6,111,914 | A | 8/2000 | Bist | 375/240 |
| 6,118,822 | A | 9/2000 | Bist | 375/240 |
| 6,140,944 | A | 10/2000 | Toyoyama | 341/63 |
| 6,144,322 | A | 11/2000 | Sato | 341/67 |
| 6,198,848 | B1 | 3/2001 | Honma et al. | 382/232 |
| 6,218,968 | B1 | 4/2001 | Smeets et al. | 341/65 |
| 6,229,460 | B1 | 5/2001 | Tsai et al. | 341/67 |
| 6,256,064 | B1 | 7/2001 | Chujoh et al. | 348/240.23 |
| 6,278,801 | B1 | 8/2001 | Boon | 382/246 |
| 6,304,607 | B1 | 10/2001 | Talluri et al. | 375/240.27 |
| 6,339,386 | B1 | 1/2002 | Cho | 341/67 |
| 6,388,588 | B2 | 5/2002 | Kitamura | 341/67 |
| 6,404,929 | B1 | 6/2002 | Boon | 382/233 |
| 6,408,029 | B1 | 6/2002 | McVeigh et al. | 375/240.13 |
| 6,445,314 | B1 | 9/2002 | Zhang et al. | 341/67 |
| 6,445,739 | B1 | 9/2002 | Shen et al. | 375/240.03 |
| 2002/0101928 | A1 | 8/2002 | Auvray et al. | 375/240.18 |

FOREIGN PATENT DOCUMENTS

WO WO 93/18616 9/1993

OTHER PUBLICATIONS

T. Chujoh & Y. Kikuchi, "An improved variable length coding", *Joint Video Team (JVT) of ISO/IEC MPEG & ITU-T VCEG*, 2nd Meeting: Geneva, CH, Jan. 29-Feb. 1, 2002.

M.Luttrell, J. Wen, H. Yao, and J. Villasen: "Robust Low Bit Rate Wireless Video Communications," Final Report, Project 97-193, University of California MICRO project, available on http://www.ucop.edu/research/micro/97_98/97_193.pdf.

P.N. Tudor, "MPEG-2 Video Compression", IEE J Langham Thompson Prize, *Electronics & Communication Engineering Journal*, Dec. 1995. Available on http://www.bbc.co.uk/rd/pubs/papers/paper_14/paper_14.html.

"H.264/MPEG-4 AVC Video Compression Tutorial", *VideoLocus*, 2002, available on http://www.videolocus.com.

K. Takagi, "Reversibility of Code", *Joint Video Team (JVT) of ISO/IEC MPEG & ITU-T VCEG*, 2nd Meeting: Geneva, CH, Jan. 29-Feb. 1, 2002.

A. Bist, "An Adaptive Quantization Scheme for H.263++", ITU-Telecommunication Standardization Sector q15a49, Working Party 15/1, Expert's Group on Very Low Bitrate Visual Telephony, Portland, Jun. 24-27, 1997.

Reed, E.C. and Lim, J.S. "Efficient Coding of DCT Coefficients by Joint Position-Dependent Encoding." *Proceedings of the 1998 IEEE International Conference on Acoustics, Speech and Signal Processing*, May 12, 1998, pp. 2817-2820, IEEE, New York, NY.

Cheung, K.M. and Kiely, A. "An Efficient Variable Length Coding Scheme for an IID Source." *Proceedings of the Data Compression Conference*, Mar. 28, 1995, pp. 182-191, IEEE Computer Society Press, Los Alamitos, CA.

Simon, S. and De Vriendt, J. "Progressive Image Transmission with Run-Length Coding." *Journal on Communications*, vol. 45, May 1994, pp. 45-50, Budapest, Hungary.

Jeon, B., Park, J. and Jeong, J. "Huffman Coding of DCT Coefficients Using Dynamic Codeword Assignment and Adaptive Codebook Selection." *Signal Processing Image Communication*, vol. 12, No. 3, Jun. 1, 1998, pp. 253-262, Elsevier Science Publishers, Amsterdam, NL.

Chandra, A. and Chakrabarty, K. "Reduction of SOC Test Data Volume, Scan Power and Testing Time Using Alternating Run-length Codes." *Proceedings of the 39th Design Automation Conference*, Jun. 10, 2002, pp. 673-678, ACM, New York, NY.

Taubman, D.S. "Section 2.4.3: Run-Length Coding." *JPEG2000: Image Compression Fundamentals, Standards, and Practice*, 2002, Kluwer Academic Publishers, Dordrecht, NL.

Golomb, S. "Run-Length Encodings." *IEEE Transactions on Information Theory*, vol. 12, No. 3, Jul. 1966, pp. 399-401.

Gallager, R.G. and Van Voorhis, D.C. "Optimal Source Codes for Geometrically Distributed Integer Alphabets." *IEEE Transactions on Information Theory*, vol. IT-21, No. 2, Mar. 1975, pp. 228-230.

VARIABLE LENGTH CODING METHOD AND APPARATUS FOR VIDEO COMPRESSION

RELATED APPLICATION(S)

The present invention claims benefit of priority of, and is a continuation of U.S. patent application Ser. No. 10/439,536 to Chen, et al., filed May 16, 2003 now U.S. Pat. No. 7,194,137 and titled VARIABLE LENGTH CODING METHOD AND APPARATUS FOR VIDEO COMPRESSION. The contents of such U.S. patent application Ser. No. 10/439,536 are incorporated herein by reference.

BACKGROUND

The present invention relates to image compression and in particular to variable length coding of quantized transform coefficients.

Variable length coding (VLC) is commonly used in digital video compression. Known transform based compression schemes, for example, divide an image into small blocks, e.g., 8×8 block, transform the blocks (interframe and/or intraframe) using a transform, e.g., the discrete cosine transform (DCT), quantize the resulting coefficients, order the quantized coefficients along a predefined path in the block to form a series of coefficients—sometimes called serializing the coefficients of the block, then statistically encode the series of coefficients using VLC to code the interframe and/or intraframe transform coefficients of each block.

Two-dimensional variable length coding (2D-VLC) is a commonly used VLC technique. In 2D-VLC, each symbol—called an "event"—that is encoded by VLC is not a single coefficient, but combines a run of preceding zero-amplitude coefficients with a non-zero coefficient. That is, each event is a doublet that includes1) the run length of zero-amplitude coefficients preceding any non-zero coefficient, and 2) the amplitude of that non-zero coefficient. The events are statistically encoded using a variable length code such that the most frequently occurring event is encoded with the shortest codeword, and the least frequently encoded events are encoded with the longest codeword.

2D-VLC is used, for example, in common coding schemes such as ISO/IEC JPEG, MPEG1, MPEG2, and MPEG4 and ITU H.261, H.262, and H.263. 2D-VLC is currently being considered for use in MPEG4-part 10 and H.264.

With the advance of integrated circuit technology, computational power and memory are becoming more available. It is therefore becoming feasible to implement variable length coding schemes that provide for more compression than conventional two-dimensional VLC.

Because of the widespread use of image coding, many patents have been issued on different forms of VLC. U.S. Pat. No. 4,698,672 issued Oct. 6, 1987 to Wen-hsiung Chen, one of the inventors of the present invention, for example described one form of a two-dimensional variable length coding method.

Implementing 2D-VLC typically includes modifying the method, for example to reduce the complexity of a hardware implementation. According to one modification, only a subset of the events is encoded using a VLC. Each of a set of less frequently occurring events is encoded with a relatively long, fixed-length codeword, and the other, relatively more frequent events are each encoded with a variable length codeword. An escape code at the beginning of the codeword is used to indicate the fixed-length codewords of the relatively infrequent events.

FIG. 1 shows how a table lookup may be used to implement a 2D-VLC scheme. Prior to the table look-up, the runlength of zero amplitudes preceding any non-zero amplitude and the non-zero amplitude are determined. The table look-up uses a 2D table for those likely events encoded using variable length encoding. The escape code fixed length codes are used for a set of relatively less likely-to-occur combinations.

In typical 2D-VLC implementations, a short end of block (EOB) code indicates the last non-zero coefficient in the block has been encountered, i.e., that the remaining coefficients in the block are all zero.

Extensions and variations to the common 2D-VLC method are known. For example, the ITU H.263 compression standard defines one such variation sometimes called three-dimensional VLC (3D-VLC). See PCT patent publication WO 9318616 published Sep. 16, 1993 titled PICTURE DATA ENCODING METHOD (or its U.S. equivalent, U.S. Pat. No. 5,579,413 titled PICTURE DATA ENCODING METHOD) and also the ITU-T H.263 standard. In 3D-VLC, each symbol ("event") is a triplet (LAST, RUN, LEVEL) that includes: LAST, a binary flag that indicates whether or not the current non-zero amplitude-value is the last non-zero coefficient in the block, RUN, the runlength of zero-value coefficients that precede the current non-zero amplitude, i.e., the number of zeroes since the last non-zero coefficient-amplitude, and LEVEL, the current non-zero coefficient-amplitude value. Thus, there is no need for a separate EOB codeword; whether or not the non-zero coefficient is the last one is incorporated into the event. U.S. Pat. No. 5,579,413 is incorporated herein by reference.

FIG. 2 shows how a table lookup may be used to implement 3D-VLC.

The existence of patents on 2D-VLC and extensions thereof, and the resulting patent disputes has made a search for alternate VLC methods important.

Thus there is a need for an efficient VLC scheme that can be used as a replacement of known 2D-VLC. There further is a need for an efficient VLC scheme that can provide better compression performance than known 2D-VLC techniques.

SUMMARY

Described herein is a method and an apparatus to encode a series of quantized values that typically are coefficients of a transform of a block of image data after ordering. A first subset of values is defined that includes the most common amplitude and at least one other amplitude. A second subset of values includes amplitudes not in the first subset. In one embodiment, the transform is such that 0 is the most likely coefficient amplitude and 1 is the next most likely coefficient amplitude. In such a case, the first subset contains values 0 and 1.

The method includes forming modes for each encountered amplitude that is not the most common amplitude, and forming events for the modes in the mode modified series formed by setting to the most common amplitude all amplitudes other than the amplitude defining the mode. An event for modes for amplitudes of the second subset is a run of none or more consecutive coefficients having the most common amplitude followed by an amplitude other than the most common in the mode modified series.

In one embodiment, a first mode is defined for amplitudes of the first subset wherein an event in the mode modified series is a run of none or more coefficients of the most common amplitude followed by the coefficient of an amplitude from the first set of values.

In another embodiment, a first mode is defined for amplitudes of the first set of values wherein an event is a run in the mode modified series of none or more coefficients of the most common amplitude followed by a run of one of a predefined set of sequences, each sequence in the set being a sequence of amplitudes of the first set of values starting with a coefficient other than the most common amplitude.

In another embodiment, a first mode is defined for amplitudes of the first set of values wherein an event is a sequence of amplitudes of the first set, the sequence having the length of the series of quantized coefficients.

The method includes forming a codeword for each encountered mode and forming codewords for the formed events in the mode. Relatively short codewords are formed to represent events that are relatively more likely to occur.

Also described herein are a method and an apparatus to decode the encoded bitstream to produce a set of quantized transform coefficients.

Other embodiments, features, aspects, and advantages will be apparent from the description below.

DETAILED DESCRIPTION

Conventional Two-Dimensional Variable Length Coding

Figure 1:
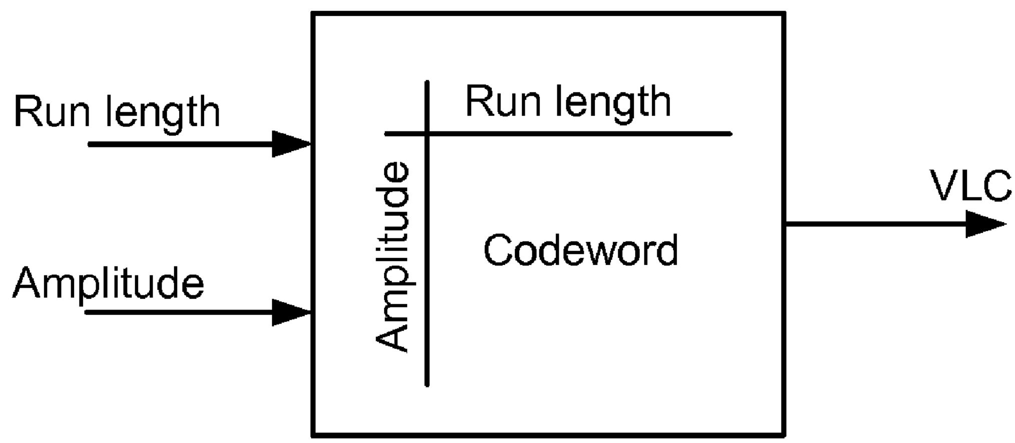
FIG. 1 shows how a prior art 2-D VLC method may be implemented by a table lookup.
Figure 2:
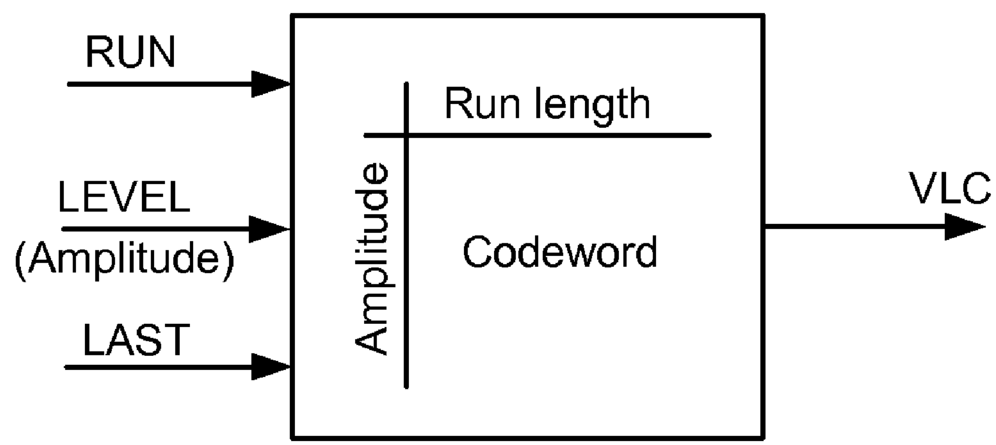
FIG. 2 shows how a common prior art variation of 2-D VLC called 3D-VLC may be implemented by a table lookup.

Variable length coding (VLC) encodes a series of digital values, e.g., of a series of coefficients resulting by transforming a two-dimensional block of an image (interframe or intraframe) and quantizing the transform assigning variable length codes, e.g., Huffman codes or arithmetic codes, according to the statistics of the coefficients so that short codewords are assigned to relatively likely events and longer codewords to less likely events. The statistics may be known or assumed a-priori, or collected on-the fly.

In 2D-VLC, the events for which codewords are formed include both the quantized coefficient-amplitude and the runlengths of the most likely-to-occur coefficients—e.g., zero-amplitude coefficients—that precedes any less than most likely-to-occur coefficient—e.g., a non-zero-amplitude coefficient when the coefficients are ordered along a specified two-dimensional path, e.g., along a zig-zag path for an 8×8 coefficient block or a 4×4 coefficient block to form a series of coefficients.

In the discussion that follows, it is assumed that zero-amplitude is the most likely-to-occur, e.g., the most frequently encountered amplitude, and that 1 is the next most likely-to-occur—next most common—amplitude. The methods described herein, however can work for other orders of likelihood, so that the most likely amplitude—the first amplitude—need not be 0, and the next most likely amplitude—the second amplitude—need not be 1. Furthermore, the discussion assumes that the likelihood-of-occurrence is indicated by the frequency of occurrence. Of course, the relative probability of occurrence need not correspond to the actual frequency of occurrence that occurs in any particular transformed image block or collection of transformed image blocks.

The occurrence information of the quantities being tracked may be tabulated in a two-dimensional table as shown in Table 1 below, where $S_{ij}$, i, j=1, 2, . . . is the number of coefficients that both have amplitude i and are preceded by j consecutive zero amplitude coefficients.

TABLE 1

Statistics collected for 2D-VLC

| Coeff. | Runlength of zero valued coefficients | | | | | | | |
|---|---|---|---|---|---|---|---|---|
| Ampl. | 0 | 1 | 2 | 3 | 4 | 5 | 6 | . . . |
| 1 | $S_{10}$ | $S_{11}$ | $S_{12}$ | $S_{13}$ | $s_{14}$ | $s_{15}$ | $s_{16}$ | . . . |
| 2 | $S_{20}$ | $S_{21}$ | $S_{22}$ | $S_{23}$ | $S_{24}$ | $S_{25}$ | $S_{26}$ | . . . |
| 3 | $S_{30}$ | $S_{31}$ | $S_{32}$ | $S_{33}$ | $S_{34}$ | $S_{35}$ | $S_{36}$ | . . . |
| 4 | $S_{40}$ | $S_{41}$ | $S_{42}$ | $S_{43}$ | $S_{44}$ | $S_{45}$ | $S_{46}$ | . . . |
| 5 | $S_{50}$ | $S_{51}$ | $S_{52}$ | $S_{53}$ | $S_{54}$ | $S_{55}$ | $S_{56}$ | . . . |
| 6 | $S_{60}$ | $S_{61}$ | $S_{62}$ | $S_{63}$ | $S_{64}$ | $S_{65}$ | $S_{66}$ | . . . |
| 7 | $S_{70}$ | $S_{71}$ | $S_{72}$ | $S_{73}$ | $S_{74}$ | $S_{75}$ | $S_{76}$ | . . . |
| 8 | $S_{80}$ | $S_{81}$ | $S_{82}$ | $S_{83}$ | $S_{84}$ | $S_{85}$ | $S_{86}$ | . . . |
| 9 | $S_{90}$ | $S_{91}$ | $S_{92}$ | $S_{93}$ | $S_{94}$ | $S_{95}$ | $S_{96}$ | . . . |
| . . . | . . . | . . . | . . . | . . . | . . . | . . . | . . . | . . . |

In 2D-VLC, the symbol ("event") is assigned a variable length code according to the frequency of occurrence (the number $S_{ij}$) and the particular VLC scheme—e.g., Huffman code or arithmetic code—being used. The most frequently occurring event, i.e., the largest $S_{ij}$—pically $S_{10}$ in transform coding—is assigned the shortest code while least occurred combination ($s_{ij}$) is assigned a code with the highest number of bits. The resulting 2D-VLC may then be represented by Table 2, where $C_{ij}$ is the VLC assigned to the event (i,j): the combination of the coefficient having amplitude i that is preceded by j consecutive zero amplitude coefficients.

TABLE 2

2D-VLC

| Coeff. | Runlength of zero valued coefficients | | | | | | | |
|---|---|---|---|---|---|---|---|---|
| Ampl. | 0 | 1 | 2 | 3 | 4 | 5 | 6 | . . . |
| 1 | $C_{10}$ | $C_{11}$ | $C_{12}$ | $C_{13}$ | $C_{14}$ | $C_{15}$ | $C_{16}$ | . . . |
| 2 | $C_{20}$ | $C_{21}$ | $C_{22}$ | $C_{23}$ | $C_{24}$ | $C_{25}$ | $C_{26}$ | . . . |
| 3 | $C_{30}$ | $C_{31}$ | $C_{32}$ | $C_{33}$ | $C_{34}$ | $C_{35}$ | $C_{36}$ | . . . |
| 4 | $C_{40}$ | $C_{41}$ | $C_{42}$ | $C_{43}$ | $C_{44}$ | $C_{45}$ | $C_{46}$ | . . . |
| 5 | $C_{50}$ | $C_{51}$ | $C_{52}$ | $C_{53}$ | $C_{54}$ | $C_{55}$ | $C_{56}$ | . . . |
| 6 | $C_{60}$ | $C_{61}$ | $C_{62}$ | $C_{63}$ | $C_{64}$ | $C_{65}$ | $C_{66}$ | . . . |
| 7 | $C_{70}$ | $C_{71}$ | $C_{72}$ | $C_{73}$ | $C_{74}$ | $C_{75}$ | $C_{76}$ | . . . |
| 8 | $C_{80}$ | $C_{81}$ | $C_{82}$ | $C_{83}$ | $C_{84}$ | $C_{85}$ | $C_{86}$ | . . . |
| 9 | $C_{90}$ | $C_{91}$ | $C_{92}$ | $C_{93}$ | $C_{94}$ | $C_{95}$ | $C_{96}$ | . . . |
| . . . | . . . | . . . | . . . | . . . | . . . | . . . | . . . | . . . |

In practice, the statistics (likelihoods of occurrence of the events) are determined a-priori—e.g., by experiments on likely sets of images—to form fixed VLC tables. Adaptive coding also may be used in which the encoding depends on statistics such as histograms collected from actual data.

In a typical transform encoding scheme that uses 2D-VLC, the transform blocks are identified as interframe (with motion compensated or not) or intraframe, and the series of quantized coefficients within each transformed block are coded using the 2D-VLC shown in Table 2 when ordered along a two-dimensional path.

In a typical implementation, a sign bit is added to identify whether the non-zero amplitude is positive or negative. Furthermore, some relatively non-frequent combinations are encoded by a fixed length code representing the combination of the runlength of zeroes and the amplitude following the runlength. An escape code identifying that a fixed length code is being used also is used at the beginning (or end) of each such fixed length codeword.

The Chen et al. 2D-VLC method of U.S. Pat. No. 4,698,672 selects the variable length codes $C_{ij}$ as follows: each runlength of zeroes followed by an amplitude 1 is encoded by a first type of variable length code for the runlength. The amplitude (1) that follows the runlength of zero amplitudes need not be encoded because any codeword encoded according to the first type of variable length code can be assumed at the decoder to have amplitude 1. Each runlength of zeroes followed by a non-zero amplitude other than 1 is encoded by a second type of variable length code for the runlength followed by a code for the amplitude.

U.S. Pat. No. 4,698,672 also describes the following extension. Suppose the series of signals, e.g., the series of transform coefficients to be encoded take on at least n+3 possible values, e.g., 0, 1, . . . , n, and at least two other values, e.g., n+1, n+2, . . . The method uses n different types of runlength codes—a first, a second, . . . , an n'th type—to respectively represent runs of none or zeroes followed by a 1, a 2, . . . , an n, respectively. The method further uses a different type of runlength code—i.e., different from the first, second, . . . , n'th type—to encode runs of zeroes followed by any one of the other values. Amplitude encoding is also to encode the amplitude, i.e., the other value that follows the run of zeroes. When one of the first, second, . . . , n'th type of code is used, the type of runlength code identifies which amplitude follows the run of zeroes. In such a case, there is no need to further amplitude encode the amplitude that follows the 0's.

Figure 3:
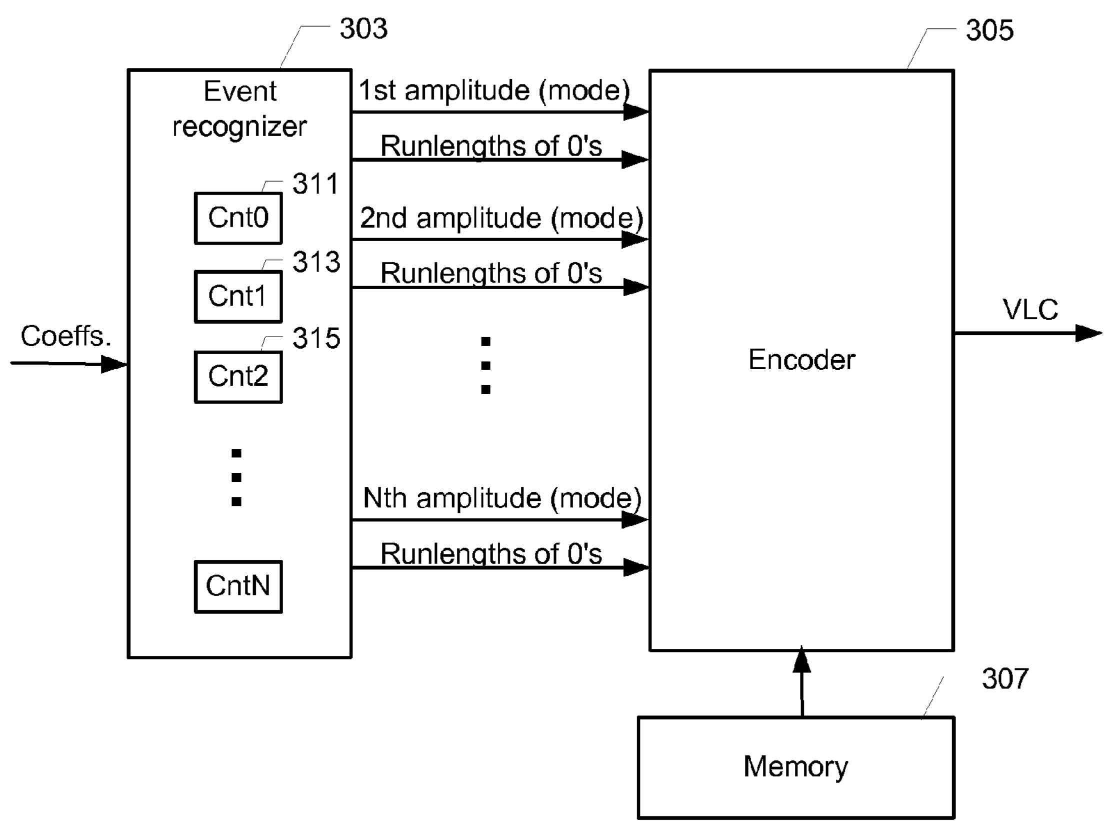
FIG. 3 shows a simplified block diagram of one embodiment of an apparatus to code a series of quantized transform coefficients.

FIG. 3 shows the length of each codeword for a common 2-D VLC used for the H.261 standard. The MPEG-1 and MPEG-2 2D-VLC tables are similar to that for H.261. Only the 113 most likely-to-occur symbols (runlength, amplitude-level) are represented. MPEG-1 and MPEG-2 use similar tables. In MPEG-1, the non-common events are encoded by 20 bits or 28 bits. The escape symbol is 6 bits, followed by a code for the runlength of zeroes followed by the amplitude level code. The 20-bit escape codewords describe levels in the range [−127, +127] while the 28-bit double escape codewords have a range of [−255, +255]. MPEG-2 increases the span to the full dynamic range of quantized inverse DCT coefficients, [−2047, +2047] and simplifies the escape mechanism with a single representation for such an event. The total length of the MPEG-2 escape codeword is 24 bits (6-bit escape code followed by a 6-bit runlength value and 12-bit amplitude level code).

Set of 1-D Variable Length Coding Tables

One aspect of the present invention replaces the 2-D variable length coding table such as Table 2 by a set of 1-D variable length coding tables, each defining a "mode." In addition, another variable length coding table identifies which mode. i.e., which 1-D table of the set of 1-D tables to use. Thus, a codeword includes a first code to identify which 1-D table, i.e., which mode, is used, and a second code to identify the set of events for that mode, i.e., the events that use that 1-D table.

Consider all the possible coefficients, and consider separately each coefficient-amplitude, i.e., with all other amplitudes 0. By the "mode-modified series" is meant the ordered series of coefficients with all amplitudes other than the amplitude defining the mode set to zero. Thus, for example, for the following series of 16 coefficients that, for example, may be the coefficients of the transform of a 4×4 block:

0 1 −1 0 3 −1 0 1 0 0 1 0 0 0 0 0,

The amplitudes are 0 1 1 0 3 1 0 1 0 0 1 0 0 0 0 0.

One considers, for amplitudes of 1, the mode-modified series of coefficients:

0 1 1 0 0 1 0 1 0 0 1 0 0 0 0 0;

for amplitudes of 2, the mode-modified series of coefficients:

0 0 0 0 0 0 0 0 0 0 0 0 0 0 0 0;

and for amplitudes of 3, the mode-modified series of coefficients:

0 0 0 0 3 0 0 0 0 0 0 0 0 0 0 0;

and so forth.

The VLC method is typically applied to transform coefficients of blocks, e.g., 4×4 or 8×8 blocks that transformed into a set of transform coefficients for the block. These blocks may be after motion compensation. The transform coefficients are quantized and the quantized block transform coefficients are ordered by scanning the two-dimensional block along a predetermined path, e.g., a zig-zag path. The ordering forms a series of coefficients for the block.

In one embodiment, the statistics of the number of contiguous zero-valued coefficients preceding a non-zero amplitude are collected for events for each such sequence having only 0's and coefficients that have a particular amplitude (all other amplitudes considered as 0). Such statistics may be written as a series of 1-D table, one such 1-D table per non-zero amplitude. Such a set of 1-D statistics tables is shown below as Tables 3-1, 3-2, 3-3, . . . :

TABLE 3-1

| Statistics collected for runs ending with 1 (all others 0) | | | | | | | |
|---|---|---|---|---|---|---|---|
| Runlength of zero valued coefficients | | | | | | | |
| 0 | 1 | 2 | 3 | 4 | 5 | 6 | . . . |
| $^1S_0$ | $^1S_1$ | $^1S_2$ | $^1S_3$ | $^1S_4$ | $^1S_5$ | $^1S_6$ | . . . |

TABLE 3-2

| Statistics collected for runs ending with 2 (all others 0) | | | | | | | |
|---|---|---|---|---|---|---|---|
| Runlength of zero valued coefficients | | | | | | | |
| 0 | 1 | 2 | 3 | 4 | 5 | 6 | . . . |
| $^2S_0$ | $^2S_1$ | $^2S_2$ | $^2S_3$ | $^2S_4$ | $^2S_5$ | $^2S_6$ | . . . |

TABLE 3-3

| Statistics collected for runs ending with 3 (all others 0) | | | | | | | |
|---|---|---|---|---|---|---|---|
| Runlength of zero valued coefficients | | | | | | | |
| 0 | 1 | 2 | 3 | 4 | 5 | 6 | . . . |
| $^3S_0$ | $^3S_1$ | $^3S_2$ | $^3S_3$ | $^3S_4$ | $^3S_5$ | $^3S_6$ | . . . |

and so fourth, where $^iS_j$ is the number of runs of length j, i.e., for a run of j zero-amplitude coefficients ending kin a coefficient of amplitude i, i=1, 2, 3, . . . , with all amplitudes not equal to i considered 0.

Note that the statistics in these tables are different from those in the different rows on Table 1. For example, $S_{33}$ in Table 1 is for sequences that have three consecutive zero amplitudes that are followed by amplitude 3 starting from any previous non-zero amplitude coefficient, while in Table 3-3, ${}^3S_3$ is for sequences that have three consecutive zero amplitudes that are followed by amplitude 3 starting from the previous amplitude-three coefficient.

Based on these statistics, or on a set of a-priori likelihoods, a series of 1-D coding tables may be constructed as follows:

TABLE 4-1

| 1-D VLC table for runs ending with 1 (all others 0) | | | | | | | |
|---|---|---|---|---|---|---|---|
| Runlength of zero valued coefficients | | | | | | | |
| 0 | 1 | 2 | 3 | 4 | 5 | 6 | . . . |
| ${}^1C_0$ | ${}^1C_1$ | ${}^1C_2$ | ${}^1C_3$ | ${}^1C_4$ | ${}^1C_5$ | ${}^1C_6$ | . . . |

TABLE 4-2

| 1-D VLC table for runs ending with 3 (all others 0) | | | | | | | |
|---|---|---|---|---|---|---|---|
| Runlength of zero valued coefficients | | | | | | | |
| 0 | 1 | 2 | 3 | 4 | 5 | 6 | . . . |
| ${}^2C_0$ | ${}^2C_1$ | ${}^2C_2$ | ${}^2C_3$ | ${}^2C_4$ | ${}^2C_5$ | ${}^2C_6$ | . . . |

TABLE 4-3

| 1-D VLC table for runs ending with 3 (all others 0) | | | | | | | |
|---|---|---|---|---|---|---|---|
| Runlength of zero valued coefficients | | | | | | | |
| 0 | 1 | 2 | 3 | 4 | 5 | 6 | . . . |
| ${}^3C_0$ | ${}^3C_1$ | ${}^3C_2$ | ${}^3C_3$ | ${}^3C_4$ | ${}^3C_5$ | ${}^3C_6$ | . . . |

and so forth, where ${}^iC_j$ is the codeword in Table 4-i, i=1, 2, 3, . . . , for a run of length j, i.e., for a run of j zero-amplitude coefficients ending in a coefficient of amplitude i (all other amplitudes considered as 0-amplitudes). The most frequently occurred statistics is assigned the shortest number of bits and the least occurred statistics is assigned the longest number of bits.

In addition, a set of statistics may be gathered for occurrences of events in each of the Tables. Such a set of statistics may be described by Table 5 as follows:

TABLE 5

| Statistics for each of Tables 3-1, 3-2, 3-3, . . . | | | | | | | |
|---|---|---|---|---|---|---|---|
| Amplitude table ends with | | | | | | | |
| 1 | 2 | 3 | 4 | 5 | 6 | 7 | . . . |
| ${}^1S_T$ | ${}^2S_T$ | ${}^3S_T$ | ${}^4S_T$ | ${}^5S_T$ | ${}^6S_T$ | ${}^7S_T$ | . . . |

where ${}^iS_T$ is the numbers of events in the mode-modified series for the mode defined by amplitude i, i.e., ${}^iS_T$ the number of runs of zero of any length that end in a coefficient of amplitude i when all other amplitudes are considered as 0. Note that ${}^TS_i$ is the total number of entries in Table 3-i, i=1, 2, 3, . . . .

Based on these statistics, or on assumed likelihoods for a run of zeroes followed by a coefficient being ending in a particular amplitude (all other amplitudes 0), a 1-D VLC table is constructed as Table 6:

TABLE 6

| Code for each of Tables 3-1, 3-2, 3-3, . . . | | | | | | | |
|---|---|---|---|---|---|---|---|
| Amplitude table ends with | | | | | | | |
| 1 | 2 | 3 | 4 | 5 | 6 | 7 | . . . |
| ${}^1C_T$ | ${}^2C_T$ | ${}^3C_T$ | ${}^4C_T$ | ${}^5C_T$ | ${}^6C_T$ | ${}^7C_T$ | . . . |

where ${}^iC_T$ is the codeword for using mode i, i.e., for using Table 4-i, i=1, 2, 3, . . . . Again, the most frequently occurred statistics (usually ${}^1C_T$ in transform coding) is assigned the shortest codeword and the least occurred table is assigned the longest codeword.

In one embodiment the coding tables, e.g., Tables 4-1, 4-2, . . . , and Table 6 are fixed, determined according to statistics are determined a-priori, e.g., by experiments on likely sets of images. In an alternate embodiment, the coding tables are changeable according to data collected on the fly, e.g., according to statistics such as histograms collected on the fly, e.g., in the form of tables such as Tables 3-1, 3-2, 3-3, . . . and so forth.

To encode the following sequence of 16 transform coefficients, e.g., of the transform of a 4×4 block:

0 1 −1 0 3 −1 0 1 0 0 1 0 0 0 0 0, the signs are ignored (see later for encoding the sign), the amplitude 1's are encoded using Table 4-1 as if there were no amplitudes other than 0's and 1's, that is, for the mode-modified series for the mode defined by amplitude 1:

0 1 1 0 0 1 0 1 0 0 1 0 0 0 0.

The amplitude 3's are encoded using Table 4-3 as if there were no amplitudes other than 0's and 3's, i.e., for the mode-modified series for the mode defined by amplitude 3:

0 0 0 0 3 0 0 0 0 0 0 0 0 0 0 0.

A code from Table 6 precedes each set of codes for each of the mode-modified series. The resulting code sequence (ignoring sign) is:

${}^1C_T\,{}^1C_1\,{}^1C_0\,{}^1C_2\,{}^1C_1\,{}^1C_2\,{}^3C_T\,{}^3C_4$ EOB where EOB is a codeword that indicates the end of block. In one embodiment, a single end of block (EOB) codeword is used to indicate no more codes for the sequence; no EOB is placed at the end of each sequence if the next codeword is a codeword from the mode table (Table 6). In another embodiment, the sequence of codewords for each mode end in an EOB.

Note that the method may be extended by one dimension in the same manner as traditional 2-D VLC can be extended to what is called 3-D VLC such that there is no need for an EOB codeword. Each table, in addition to having the runlength, includes binary flag LAST, that indicates whether or not that coefficient is the last coefficient in the block of that amplitude. See above-referenced PCT patent publication WO 9318616, incorporated herein by reference.

In this discussion, it is assumed that 0-amplitude is the most likely-to-occur, e.g., the most frequently encountered amplitude, and that 1 is the next most likely-to-occur—next most common—amplitude. This corresponds to experience that events that end in 1 occur more frequently than events ending with amplitude 2 or higher, especially for interframe coded blocks, e.g., transformed blocks of motion compensated prediction residuals. This is particularly true for small blocks, e.g., 4×4 blocks that occur in the proposed H.264 standard.

Thus, with the above described embodiment using a series-of-1-D tables, we expect the runs to be longer than with 2-D VLC; the run in each event in any mode, i.e., using any particular 1-D table is a run from the previous identical coefficient, while in 2-D VLC, the run is from the previous non-zero-amplitude coefficient. Nevertheless, because the codes for each 1-D table (Table 4-I) is expected to be shorter than 2-D table (Table 2) and because most codes from the amplitude-1 table, and the code indicating such a table is likely to be relatively short, we expect the complete code for a sequence of amplitudes to be competitive with that using 2-D-VLC.

In one embodiment, some relatively non-frequent events are encoded by a fixed length code representing the combination of the runlength of zeroes and the amplitude following the runlength. An escape code identifying that a fixed length code is being used also is used at the beginning of each such fixed length codeword. In one implementation, a single representation is used for the less likely-to-occur events that are encoded by a fixed length codeword.

A Variable Length Coding Table of Likely Events and a Further Set of 1-D Variable Length Coding Tables Another embodiment produces efficient codes in the case that events that are a sequence of none or more zero-amplitude coefficients followed by patterns of 0- and 1-amplitudes. Such events are assumed but not required to be more likely to occur than events that are a sequence of none or more zero-amplitude coefficients followed by an amplitude larger than 1. Such a situation may be applicable, for example, for small interframe coded blocks, say 8×8 or 4×4 blocks of interframe transform coefficients after motion compensation.

According to such an embodiment, a first subset of amplitudes is defined, including the most common amplitude and one or more of the next most common amplitudes. The other amplitudes are defined as a second subset of amplitudes. In one implementation, the first subset of amplitudes consists of 0 and 1, the two most likely-to-occur amplitudes, and the second subset consists of those amplitudes that are larger than 1. A set of tables is defined. The first table is for runs of the most likely-to-occur amplitude followed by one of the predefined set of sequences, where of the predefined set of sequences is a sequence of at least one coefficient from the first subset of amplitudes, starting with an amplitude other than the most likely-to-occur. Because events are defined by runs of none or more coefficients having the most likely to occur amplitudes, each of the sequences in the predefined set typically also ends with an amplitude other than the most likely-to-occur. All other amplitudes are set to the most likely-to-occur. Typically, the first subset consists of 0 and 1, and the sequences in the predefined set are sequences of only 0's and 1. Thus a first mode is defined by amplitude 1, and the events are runs of none or more zero-amplitudes followed by one or more repetitions of a sequence of the predefined set in the mode-modified series. The other tables are each for a mode defined by one of the amplitude of the second subset of amplitudes, e.g., an amplitude greater than 1. An event is a run of none or more of the most likely-to-occur amplitude followed by a single amplitude of the second subset of amplitudes, with all other amplitudes set to the most likely-to-occur, i.e., for the mode-modified series for the mode defined by the single amplitude. There are further tables, one for runs of none or more 0-amplitides followed by each of 2, 3, 4, and so forth. These tables for the same events as shown above in Tables 3-2, 3-3, . . . .

Once the set of sequences is defined, in one embodiment, statistics may be gathered for the symbols (events) that include a run of 0 amplitudes followed by a run of one of the set of sequences of the predefined set, all other amplitudes set to 0. Table 7-1 shows one such set of statistics.

TABLE 7-1

Statistics for coeff. ampl. patterns preceded by zero coeff. amplitudes

| Coeff. Ampl. | Runlength of zero valued coefficients | | | | |
|---|---|---|---|---|---|
| Pattern | 0 | 1 | 2 | 3 | . . . |
| 1 | S1-1-0 | S1-1-1 | S1-1-2 | S1-1-3 | . . . |
| 11 | S1-2-0 | S1-2-1 | S1-2-2 | S1-2-3 | . . . |
| 111 | S1-3-0 | S1-3-1 | S1-3-2 | S1-3-3 | . . . |
| . . . | . . . | . . . | . . . | . . . | . . . |
| 111111 | S1-6-0 | S1-6-1 | S1-6-2 | S1-6-3 | . . . |
| 101 | S101-1-0 | S1-1-1 | S1-1-2 | S1-1-3 | . . . |
| 1001 | S1001-1-0 | S1001-1-1 | S1001-1-2 | S1001-1-3 | . . . |
| 1101 | S1101-1-0 | S1101-1-1 | S1101-1-2 | S1101-1-3 | . . . |
| 1011 | S1011-1-0 | S1011-1-1 | S1011-1-2 | S1011-1-3 | . . . |
| 10001 | S10001-1-0 | S10001-1-1 | S10001-1-2 | S10001-1-3 | . . . |
| 11001 | S11001-1-0 | S11001-1-1 | S11001-1-2 | S11001-1-3 | . . . |
| 10101 | S10101-1-0 | S10101-1-1 | S10101-1-2 | S10101-1-3 | . . . |
| 10011 | S10011-1-0 | S10011-1-1 | S10011-1-2 | S10011-1-3 | . . . |
| 11101 | S11101-1-0 | S11101-1-1 | S11101-1-2 | S11101-1-3 | . . . |
| 10111 | S10111-1-0 | S10111-1-1 | S10111-1-2 | S10111-1-3 | . . . |
| 101101 | S101-2-0 | S101-2-1 | S101-2-2 | S101-2-3 | . . . |

The Quantity Si-j-k in this case is the statistic for a run of k 0-amplitudess to be followed by j repeats of the sequence i. Therefore, S101-3-4 is the sequence of coefficient-amplitudes 000101101 which is four 0's followed by two repeats of the sequence 101.

A variable length code is then derived for each of the Si-j-k to provide a VLC table as shown in Table 8-1.

TABLE 8-1

VLC for coeff. ampl. patterns preceded by zeroes

| Coeff. Ampl. | Runlength of zero valued coefficients | | | | |
|---|---|---|---|---|---|
| Pattern | 0 | 1 | 2 | 3 | |
| 1 | C1-1-0 | C1-1-1 | C1-1-2 | C1-1-3 | . . . |
| 11 | C1-2-0 | C1-2-1 | C1-2-2 | C1-2-3 | . . . |
| 111 | C1-3-0 | C1-3-1 | C1-3-2 | C1-3-3 | . . . |
| . . . | . . . | . . . | . . . | . . . | . . . |
| 111111 | C1-6-0 | C1-6-1 | C1-6-2 | C1-6-3 | . . . |
| 101 | C101-1-0 | C101-1-1 | C101-1-2 | C101-1-3 | . . . |
| 1001 | C1001-1-0 | C1001-1-1 | C1001-1-2 | C1001-1-3 | . . . |
| 1101 | C1101-1-0 | C1101-1-1 | C1101-1-2 | C1101-1-3 | . . . |
| 1011 | C1011-1-0 | C1011-1-1 | C1011-1-2 | C1011-1-3 | . . . |
| 10001 | C10001-1-0 | C10001-1-1 | C10001-1-2 | C10001-1-3 | . . . |
| 11001 | C11001-1-0 | C11001-1-1 | C11001-1-2 | C11001-1-3 | . . . |
| 10101 | C10101-1-0 | C10101-1-1 | C10101-1-2 | C10101-1-3 | . . . |
| 10011 | C10011-1-0 | C10011-1-1 | C10011-1-2 | C10011-1-3 | . . . |
| 11101 | C11101-1-0 | C11101-1-1 | C11101-1-2 | C11101-1-3 | . . . |
| 10111 | C10111-1-0 | C10111-1-1 | C10111-1-2 | C10111-1-3 | . . . |
| 101101 | C101-2-0 | C101-2-1 | C101-2-2 | C101-3-3 | . . . |

The other tables are identical to Tables 3-2, 3-3, etc., and the coding tables are the same as Tables 4-2, 4-3, etc.

Different versions can include more or fewer sequences in the set of sequences. One embodiment includes every sequence that starts and begins with amplitude 1. Another includes just those shown in Table. 8-1. Furthermore, while one version has some repetitions of each sequence, another version has only one instance of each of the sequences. Yet another versions has repetitions of some sequences, e.g., of single amplitude 1's, but not of some other sequences. For example, one version includes only up to six consecutive amplitude-1's, and only a sequence of two 101 's, as shown in Table. 8-1.

In addition, a Table of statistics similar to Table 5 may be collected, except that the first column are the statistics for the events that are in Table 8-1.

TABLE 9

| Statistics for each of Tables 7-1, 3-2, 3-3, . . . | | | | | | | |
|---|---|---|---|---|---|---|---|
| Amplitude table ends with | | | | | | | |
| 1 | 2 | 3 | 4 | 5 | 6 | 7 | . . . |
| $^1S_T$ | $^2S_T$ | $^3S_T$ | $^4S_T$ | $^5S_T$ | $^6S_T$ | $^7S_T$ | . . . |

where $^1S_T$ is the number of runs of Table 7-1 and $^iS_T$, i>1 is the total number of entries in Table 3-i, i=2, 3, 4, . . . .

Based on these statistics, or on assumed likelihoods for a run of zeroes followed by a coefficient being ending in a particular sequence or repetition of a sequence of the predefined set, or an amplitude>1, (all other amplitudes 0), a 1-D VLC table is constructed as Table 10:

TABLE 10

| Code for each of Tables 7-1, 3-2, 3-3, . . . | | | | | | | |
|---|---|---|---|---|---|---|---|
| Amplitude table ends with | | | | | | | |
| 1 | 3 | 3 | 4 | 5 | 6 | 7 | . . . |
| $^1C_T$ | $^2C_T$ | $^3C_T$ | $^4C_T$ | $^5C_T$ | $^6C_T$ | $^7C_T$ | . . . |

where $^1C_T$ is the code for using Table 8-1, and $^iC_T$, i>1, is the code for using Table 4-i, i=2, 3, 4, . . . . Again, the most frequently occurred statistics (usually $^1C_T$ in transform coding) is assigned the shortest number of bits and the least occurred table is assigned the longest number of bits.

Again, one embodiment uses fixed tables, constructed, for example, from a-priori statistics. Such statistics may be obtained from experiments performed to determine the set of most likely sequences and the relative likelihood of a run of 0's following one or more repeats of such predefined sequences, all other coefficients 0. In another embodiment, the tables are changeable according to actual data.

To use the coding tables, in one version, after the transform blocks are identified as interframe (including motion compensated interframe) or intraframe mode, the series of quantized transform coefficients within the block are coded according to the above table.

As an example, to encode the following sequence of 16 transform coefficients, e.g., of the transform of a 4×4 block:

0 1 −1 0 3 −1 0 1 0 0 1 0 0 0 0 0, the signs are ignored (see later for encoding the sign), the amplitude 1's are encoded using Table 8-1 as if there were no amplitudes other than 0's and 1 's. That is, for the mode-modified series for amplitude 1:

0 1 1 0 0 1 0 1 0 0 1 0 0 0 0 0.

The amplitude 3's are encoded using Table 4-3 as if there were no amplitudes other than 0's and 3's, i.e., for the mode-modified series for amplitude 3:

0 0 0 0 3 0 0 0 0 0 0 0 0 0 0 0.

A code from Table 10 precedes each set of codes for each of the sequences. The resulting code sequence (ignoring sign) is:

$^1C_T$ C11001−1−1 C1001−1−1 $^3C_T$ $^3C_4$ EOB where EOB is a codeword that indicates the end of block. In one embodiment, a single end of block (EOB) codeword is used to indicate no more codes for the sequence; no EOB is placed at the end of each sequence if the next codeword is a codeword from the mode table (Table 10). In another embodiment, the sequence of codewords for each mode end in an EOB.

In one embodiment, some relatively non-frequent events are encoded by a fixed length code.

A Variable Length Coding Table of all Events with Likely Coefficients and a Further Set of 1-D Variable Length Coding Tables The current proposed transform coding scheme MPEG-4 part 10 and H.264 transform encodes blocks of 4 by 4 coefficients. The likelihood of amplitudes larger than 1 is then much smaller than of amplitudes of 0 and 1. A sequence of 16 of 0's and 1's has $2^{16}$ possible arrangements. In another embodiment, the first table, of only 0's and 1's, includes variable length codes for all possible combinations of 0's and 1's. With the falling cost of memory, storing such a table is practical for 4×4 (and even larger) blocks. Such a 1-D code table is shown below as Table 11-1.

TABLE 11-1

| VLC for coeff. ampl. patterns | |
|---|---|
| Coeff. Ampl. Pattern | VLC |
| 0000000000000001 | C-1 |
| 0000000000000010 | C-2 |
| 0000000000000011 | C-3 |
| 0000000000000100 | C-4 |
| 0000000000000101 | C-5 |
| 0000000000000110 | C-6 |
| 0000000000000111 | C-7 |
| 0000000000001000 | C-8 |
| 0000000000001001 | C-9 |
| . . . | . . . |
| . . . | . . . |
| 1111111111111110 | $C\text{-}2^{16} - 2$ |
| 1111111111111111 | $C\text{-}2^{16} - 1$ |

Table 11-1 is constructed by either gathering statistics or by a-priori assumptions or experiments on the likelihood of each sequence (all coefficients greater than 1 set to 0), and then assigning a variable length code to each sequence. A further table of codes is constructed for when to use Table 11-1, and when to use code Tables 4-2, 4-3, etc. A code table similar to Table 6 can be constructed to assign a codeword to indicate which of Tables 11-1, 4-2, 4-3, etc. to use. In this embodiment, $^1C_T$ is the code for using Table 11-1, and $^iC_T$, i>1, is the code for using Table 4-i, i=2, 3, 4, . . . .

When a mode indicates use of Table 11-1, there is no need to determine the runlength of the preceding 0's—the complete sequence and looks up the VLC in Table 11-1.

Consider again the example to encode the following sequence of 16 transform coefficients, e.g., of the transform of a 4×4 block:

0 1 −1 0 3 −1 0 1 0 0 1 0 0 0 0 0, the signs are ignored (see later for encoding the sign). The amplitude 1's are encoded using Table 11-1 as if there were no amplitudes other than 0's and 1's. That is, for the mode-modified series for amplitude 1:

0 1 1 0 0 1 0 1 0 0 1 0 0 0 0 0.

The amplitude 3's are encoded using Table 4-3 as if there were no amplitudes other than 0's and 3's, i.e., for the mode-modified series for amplitude 3:

0 0 0 0 3 0 0 0 0 0 0 0 0 0 0 0.

A code from Table 6 precedes each set of codes for each of the sequences. The resulting code sequence (ignoring sign) is:

$^{1}C_{T}$ C–0110010100100000 $^{3}C_{T}$ $^{3}C_{4}$ EOB so that there is only a single codeword, C–0110010100100000 in the mode for Table 11-1.

In one embodiment, some relatively non-frequent events are encoded by a fixed length code.

Encoding the Sign Information

Another aspect of the invention is encoding the sign information. Each coefficient may be positive or negative. Thus, the formed codewords for a set of events are encoded with information indicative of the sign of any non-zero amplitudes in the events.

In conventional 2-D VLC, the sign information adds a bit to each codeword. In one embodiment of the present invention, each codeword from one of the sequence of 1-D coding tables includes a sign bit to indicate the sign. That is, when the event is a run that ends with a particular amplitude, a further bit is included in the code sequence for use of each 1-D coding table to indicate the sign bit.

Referring to the embodiment that uses a set of 1-D coding tables, consider the example of encoding the following sequence of 16 transform coefficients:

0 1–1 0 3–1 0 1 0 0 1 0 0 0 0 0.

the amplitude 1's are encoded using Table 4-1 as if there were no amplitudes other than 0's and 1's. That is, for the mode-modified series for amplitude 1:

0 1–1 0 0–1 0 1 0 0 1 0 0 0 0 0.

The amplitude 3's are encoded using Table 4-3 as if there were no amplitudes other than 0's and 3's, i.e., for the mode-modified series for amplitude 1:

0 0 0 0 3 0 0 0 0 0 0 0 0 0 0 0.

Let $s_{+}$ refer to the sign bit for a positive coefficient and let $s_{-}$ refer to the code bit for a negative coefficient. A code from Table 6 precedes each set of codes for each of the sequences. The resulting code sequence is:

$^{1}C_{T}$ $^{1}C_{1}s_{+}$ $^{1}C_{0}$ $s_{-}$ $^{1}C_{2}$ $s_{-}$ $^{1}C_{1}$ $s_{+}$ $^{1}C_{2}$ $s_{+}$ $^{3}C_{T}$ $^{3}C_{4}$ $s_{+}$ EOB where EOB is a codeword that indicates the end of block.

This is also applicable to each of the 1-D tables for the embodiments that use a variable length coding table of some common events with likely coefficients and a further set of 1-D variable length coding tables, and for the embodiments that use a variable length coding table of all events with likely coefficients and a further set of 1-D variable length coding tables.

In a first alternate embodiment, a value of +1 is distinguished from a value of –1 for the coding table of the events that have the common amplitudes of 0 and 1 and in the mode-modified series for the mode defined by amplitude 1. Thus, Table 8-1 for a set of binary (0 or 1) amplitudes is replaced with Table 12-1 shown below of ternary values, 0, +1, and –1, where an event is a run of consecutive 0's followed by a common sequence of 0, +1, and –1, starting with either +1 or –1. Typically, the sequences also end with either +1 or –1.

TABLE 12-1

VLC for coeff. patterns preceded by zeroes

| Coeff. Ampl. | Runlength of zero valued coefficients | | | |
|---|---|---|---|---|
| Pattern | 0 | 1 | 2 | ... |
| +1 | $^{+1}$C-1-0 | $^{+1}$C-1-1 | $^{+1}$C-1-2 | ... |
| +1 + 1 | $^{+1}$C-2-0 | $^{+1}$C-2-1 | $^{+1}$C-2-2 | ... |
| ... | ... | ... | ... | ... |
| +1 + 1 + 1 + 1 + 1 + 1 | $^{+1}$C-6-0 | $^{+1}$C-6-1 | $^{+1}$C-6-2 | ... |
| −1 | $^{-1}$C-1-0 | $^{-1}$C-1-1 | $^{-1}$C-1-2 | ... |
| −1 − 1 | $^{-1}$C-2-0 | $^{-1}$C-2-1 | $^{-1}$C-2-2 | ... |
| ... | ... | ... | ... | ... |
| −1 − 1 − 1 − 1 − 1 − 1 | $^{-1}$C-6-0 | $^{-1}$C-6-1 | $^{-1}$C-6-2 | ... |
| +1 − 1 | $^{+1-1}$C-1-0 | $^{+1-1}$C-1-1 | $^{+1-1}$C-1-2 | ... |
| −1 + 1 | $^{-1+1}$C-1-0 | $^{-1+1}$C-1-1 | $^{-1+1}$C-1-2 | ... |
| +1 + 1 − 1 | $^{+1+1-1}$C-1-0 | $^{+1+1-1}$C-1-1 | $^{+1+1-1}$C-1-2 | ... |
| ... | ... | ... | ... | ... |
| +10 + 1 | $^{+10+1}$C-1-0 | $^{+10+1}$C-1-1 | $^{+10+1}$C-1-2 | ... |
| +10 − 1 | $^{+10-1}$C-1-0 | $^{+10-1}$C-1-1 | $^{+10-1}$C-1-2 | ... |
| −10 + 1 | $^{-10+1}$C-1-0 | $^{-10+1}$C-1-1 | $^{-10+1}$C-1-2 | ... |
| −10 − 1 | $^{-10-1}$C-1-0 | $^{-10-1}$C-1-1 | $^{-10-1}$C-1-2 | ... |
| +100 + 1 | $^{+100+1}$C-1-0 | $^{+100+1}$C-1-1 | $^{+100+1}$C-1-2 | ... |
| +100 − 1 | $^{+100-1}$C-1-0 | $^{+100-1}$C-1-1 | $^{+100-1}$C-1-2 | ... |
| −100 + 1 | $^{-100+1}$C-1-0 | $^{-100+1}$C-1-1 | $^{-100+1}$C-1-2 | ... |
| −100 − 1 | $^{-100-1}$C-1-0 | $^{-100-1}$C-1-1 | $^{-100-1}$C-1-2 | ... |
| +1 + 10 + 1 | $^{+1+10+1}$C-1-0 | $^{+1+10+1}$C-1-1 | $^{+1+10+1}$C-1-2 | ... |
| ... | ... | ... | ... | ... |
| −10 − 1 − 10 − 1 | $^{-10-1}$C-2-0 | $^{-10-1}$C-2-1 | $^{-10-1}$C-2-2 | ... |

where quantity $^{i}$C-j-k in this case is the codeword for a run of k 0-amplitudes to be followed by j repeats of the sequence i, where i is a sequence that starts and ends with +1 or –1, and contains only 0, +1, and –1. Therefore, $^{+100-1}$C-3-2 would be the codeword for the event

00+100–1+100–1+100–1, which is a run of two 0-amplitides followed by three repetitions of the coefficient sequence +100–1. This assumes that the set of sequences to be encoded by this table includes three repetitions of the coefficient sequence +100–1. As described above, a subset of possible coefficient sequences that include the likely values 0, +1, and –1 is selected to be included in the table.

One embodiment selects single instances of a sequence of a predefined set of sequences—a subset of possible sequences—of coefficients that include likely values 0, +1, and –1, starting (and typically ending) in a non-zero-amplitude, while another embodiment, e.g., of Table 12-1, allows some repetitions of the sequences of the predefined set.

As an example, to encode the following sequence of 16 transform coefficients, e.g., of the transform of a 4×4 block:

0 1–1 0 3–1 0 1 0 0 1 0 0 0 0 0, the amplitudes 1's are encoded using Table 12-1 as if there were no amplitudes other than 0's and 1 's. That is, for the mode-modified series for amplitude 1:

0 1–1 0 0–1 0 1 0 0 1 0 0 0 0 0.

The amplitude 3's are encoded using Table 4-3 as if there were no amplitudes other than 0's and 3's, i.e., for the mode-modified series for amplitude 3:

0 0 0 0 3 0 0 0 0 0 0 0 0 0 0 0.

A code from Table 10 (assuming $^{1}C_{T}$ indicates using Table 12-1) precedes each set of codes for each of the sequences. The resulting code sequence is:

$^{1}C_{T}$ $^{+1-100-1}$C-1-1 $^{+100+1}$C-1-1 $^{3}C_{T}$ $^{3}C_{4}$ $s_{+}$EOB, where $s_{+}$the sign encoding for +as above for the tables of amplitude greater than 1, and EOB is a codeword that indicates the end of block. This assumes that +1–100– is one of the sequences included in Table 12-1.

Similarly, for the embodiment that includes a variable length coding table of all events with likely coefficients and a further set of 1-D variable length coding tables, Table 11-1 can be replaced by a coding table that differentiates between +1 and −1, i.e., of all events that are sequences of 0, +1, and −1. For a sequence of N coefficients, there are $3^N-1$ such sequences. For a block of 4 by 4, that means $3^{16}-1$ entries in the table. This is slightly over 43 million entries. With the cost of memory steadily falling, such a table is fast becoming practical.

According to another aspect of the invention, the sign information is encoded in the form of information related to a change of sign. We call this differential sign encoding.

According to one embodiment of differential sign encoding, the information related to a change of sign is for any change of sign of non-zero-coefficients in the series of coefficients.

Differential sign encoding is applicable to using a series of 1-D tables, e.g., to code Tables 4-1, 4-2, 4-3, and so forth, and for those embodiments that use a coding table of a subset of sequences of common amplitudes, or a table of all sequences of common amplitudes, to the 1-D tables for amplitudes greater than 1, e.g., code Tables 4-2, 4-3, and so forth.

According to one embodiment that uses differential sign encoding, an identifiable code is used to indicate whenever the change changes from + to −, and from − to +. One version assumes the first sign is +, while another assumes the first sign is −. Yet another starts with a code that indicates whether the first sign is + or −, and then proceeds to encode change of sign only.

One embodiment uses differential sign encoding within each mode for the mode-related series. The information related to a change of sign is for any change of sign of non-zero-coefficients in the mode related series of coefficients. Consider again the example of encoding the following sequence of 16 transform coefficients, e.g., of the transform of a 4×4 block:

0 1 −1 0 3 −1 0 1 0 0 1 0 0 0 0 0.

Assume a method according to which the first sign is assumed +. Let $s_c$ be a unique code that indicates change of sign. The amplitude 1's are encoded using Table 4-1 as if there were no amplitudes other than 0's and 1's. That is for the mode-modified series for amplitude 1:

0 1 −1 0 0 −1 0 1 0 0 1 0 0 0 0 0.

The amplitude 3's are encoded using Table 4-3 as if there were no amplitudes other than 0's and 3's, i.e., for the mode-modified series for amplitude 3:

0 0 0 0 3 0 0 0 0 0 0 0 0 0 0 0.

A code from Table 6 precedes each set of codewords for the use of each 1-D table. The resulting code sequence is:

${}^1C_T\,{}^1C_1\,s_c\,{}^1C_0\,{}^1C_2\,s_c\,{}^1C_1\,{}^1C_2\,{}^3C_T\,{}^3C_4$ EOB where EOB is a codeword that indicates the end of block, and where the change of sign codeword precedes the codeword that has the new sign. In an alternate embodiment, the change of sign codeword follows rather than precedes the codeword that has the new sign.

For the embodiment that includes an indication of the first sign, the resulting code sequence is:

${}^1C_T\,s_+\,{}^1C_1\,s_c\,{}^1C_0\,{}^1C_2\,s_c\,{}^1C_1\,{}^1C_2\,{}^3C_T\,s_+\,{}^3C_4$ EOB where $s_+$ and $s_-$ indicate the first coefficient is +ve and a −ve, respectively, EOB is a codeword that indicates the end of block, and where the initial sign and change of sign codewords precede the codeword that has the sign.

According to another alternate embodiment, the encoding of the signs of the coefficients includes encoding the sequence of signs of all the non-zero coefficients to produce a separate sign codeword for all the signs. Only the non-zero coefficients are encoded. Such encoding can be done only according to relative positioning of the non-zero coefficients, and irrespective of the actual position of the non-zero coefficients, e.g., irrespective of the length of the run of zero-amplitude coefficients that precede a non-zero coefficient.

For the example sequence of 16 transform coefficients:

0 1 −1 0 3 −1 0 1 0 0 1 0 0 0 0 0, the signs are

+−+−++.

Because in typical transforms of residual images after motion compensation, most coefficients are zero, i.e., fewer non-zero coefficients are more likely than many non-zero coefficients, in one embodiment the coding of the sign sequence is to code 1 for + and 0 for −, preceded by a unique code that indicates the codeword follows. This provides a variable length code. As an example, the variable code word for the above sign sequence would be $c_s$ 1 0 1 0 1 1, where $c_s$ is the code that indicates the sign codeword follows. In another embodiment, no $c_s$ code is used or needed. The sign sequence may be attached at the end of the EOB.

An Apparatus for Encoding

FIG. 3 shows one embodiment 300 of an apparatus for encoding according to the VLC embodiment that uses Table 6 and Tables 4-1, 4-2, . . . One embodiment uses a set of 1-D lookup tables such as Tables 4-1, 4-2, . . . and a lookup table such as Table 6 to include a code codeword. When applied to transform encoding, a series of quantized transform coefficients is obtained by transforming a 2D image-block, ordering the transform coefficients along a path in the block, and quantizing the coefficients. The series of coefficients is entered in an event recognizer 303 that in one embodiment includes a recognizer that recognizes non-zero amplitudes—called a mode recognizer—and generates a set of events for each such non-zero amplitudes as if all other amplitudes were zero, i.e., for each mode modified series for the mode. For each non-zero amplitude encountered, the event recognizer determines a set of runlengths of each run of 0's from the last such non-zero amplitude (or the start of the sequence) until the next non-zero amplitude encountered as if no other non-zero amplitudes existed. One version of the runlength determining uses counters that operate in parallel. In such version, a single counter 311 continues counting from the start of the sequence. Each time a previously-unencountered non-zero amplitude is encountered, the value from the main counter is transferred as the first runlength for that amplitude and a new counter is started for that amplitude. In FIG. 3, the counters for each such amplitude are shown as 313, 315, . . . , and annotated as cnt1, cnt2, . . . , cntN for N different amplitudes that are found.

One embodiment of the event recognizer 303 that uses parallel counters passes sets of events in parallel to an encoder 305, one set for each non-zero amplitude encountered. FIG. 3 shows the case for N different amplitudes. Each set of events includes the amplitude (or mode) for the set and a sequence of runlengths of zeroes that are between such amplitudes (assuming all other amplitudes are 0).

The encoder 305 is coupled to a memory 307 that stores the information in the 1-D coding tables 4-1, 4-2, . . . , and also the coding table (Table 6). The encoder 305 includes a lookup device to look up the coding table to output the codeword for the mode, and then looks up the coding table for the sequence of runlengths for such mode (as if all other amplitudes are 0). One embodiment uses the runlength as an index for the codes stored in an indexed list. As described above, for some of the events, a fixed length codeword with an escape code is formed (see below). The encoder then outputs the complete sequences of codewords for each mode, each starting with the codeword for the mode. Sign information also is included.

While the embodiment shown in FIG. 3 has the memory 307 that stores the lookup table separate from the lookup device, in another embodiment, the memory is part of the lookup device of encoder 305.

Figure 4:
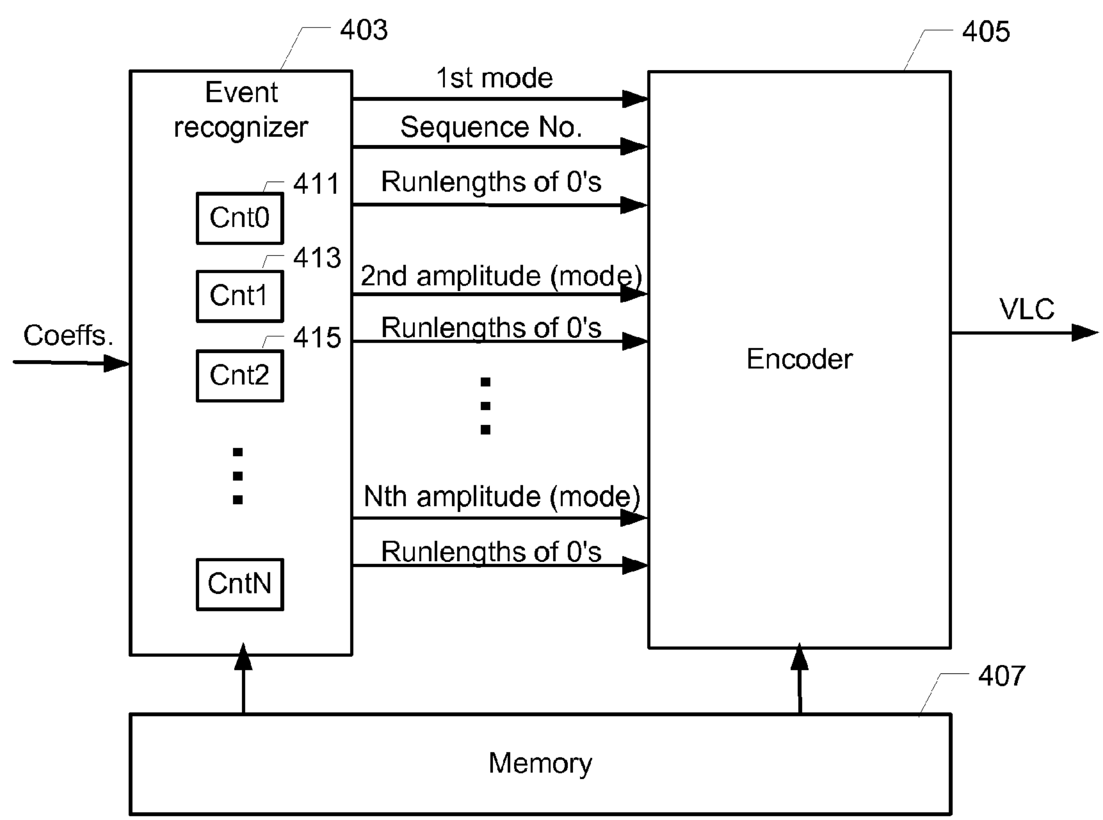
FIG. 4 shows a simplified block diagram of one embodiment of a coding apparatus that encodes using VLC.

FIG. 4 shows an embodiment 400 of an apparatus that implements another of the method embodiments described above, wherein one of the modes is for runs of 0-amplitudes followed by one of a set of pre-defined sequences of amplitudes 1 and 0, starting and ending with an amplitude of 1. In particular, the embodiment 400 implements a version that uses the coding tables Table 8-1, 4-2, 4-3, . . . , and the mode coding Table 10. In one version, the coding table 8-1 only includes single repetitions of any of the pre-defined sequences. How to modify for repetitions of any of the pre-defined set of sequences would be clear to those in the art.

As above, when applied to transform encoding, a series of quantized transform coefficients is obtained by transforming a 3D image-block, ordering the transform coefficients along a path in the block, and quantizing the coefficients. The series of coefficients is entered in an event recognizer 403 that in one embodiment includes a sequence pattern recognizer that recognizes which of a predefined set of M sequences of amplitude-1's and 0's follows a run of none or more 0's. The event recognizer 403 further recognizes which of non-zero amplitude greater than 1 follows a run of none or more 0's. The event recognizer further determines the runlength of the run of 0's from the last recognized sequence of the predefined set as if all other amplitudes are 0. Furthermore, for each non-zero amplitude other than 1 encountered, the event recognizer determines a set of runlengths of each run of 0's from the last such non-zero amplitude (or the start of the sequence) until the next non-zero amplitude encountered as if no other non-zero amplitudes existed.

One version of the runlength determining uses counters that operate in parallel. In such version, a single counter 411 continues counting from the start of the sequence. The first time one of the predefined sequences is encountered, a counter 413 is stated. Each time a previously-unencountered non-zero amplitude other than 1 is encountered, the value from the main counter is transferred as the first runlength for that amplitude and a new counter is started for that amplitude. In FIG. 3, the counters for each such amplitude are shown as 415, . . . , and annotated as cnt2, . . . , cntN for N−1 such different amplitudes greater than 1 that are found.

Each of the predefined set of sequences has a sequence number. The event recognizer 403 is coupled to memory 407 that stores the subset of sequences. The event recognizer outputs information to an encoder 405. The outputs for amplitudes greater than 1 are the same as for the embodiment 300 of FIG. 3, and for the sequence, the output is a mode indicator, followed by a sequence of two numbers for each recognized sequence: the recognized sequence number and the runlength of 0's since the last recognized sequence as if all other amplitudes were 0.

The encoder 405 that in one embodiment includes a lookup device that is coupled to a memory that stores the information in Table 8-1, Tables 4-2, 403, . . . , and Table 10. In one embodiment, the same memory 407 is used to store the tables as is used to store the sequences. In another, separate memories are used.

While the embodiment shown in FIG. 4 has the memory that stores the lookup table separate from the lookup device, in another embodiment, the memory that stores the coding tables is part of the lookup device in encoder 405. The phrase "the lookup device is coupled to a memory" includes the case that the lookup device includes the memory.

As is known in the art, an end-of-block (EOB) indicator can be used with any of the encoding schemes described above to indicate the end of a block, i.e., that all remaining coefficients in the block have zero amplitude.

In alternate versions of each of the encoding schemes, whether or not the end of block is reached can be included as part of the event. In other words, an event now includes an additional "dimension" called "last" that indicated whether or not the event is the last in the block, i.e., the remaining coefficients in the block following the event are all the most common amplitude (zero).

Note that the apparatuses described above can be modified to include all the alternatives described above for encoding the sequence of coefficients, and how to so modify the apparatuses would be clear to one in the art. Furthermore, the apparatuses described above can be modified to include all the above described above methods for encoding the sign information, and how to so modify the apparatuses would be clear to one in the art.

Decoding

Another aspect of the invention is a method for decoding a bitstream encoded by any of the encoding methods described herein. For example, one aspect is a method to decode a bitstream that is coded by a method that includes modes of codewords. In one embodiment, the mode is defined as a non-zero amplitude. A codeword defines the mode, and within each mode, a codeword is formed for each run of none or more zero-valued coefficients followed by that amplitude when all other amplitudes are defined as 0. In another version, one of the modes is for amplitude 1 coefficients, and for that mode, a codeword is formed for each run of none or more zero-valued coefficients followed by a run of one of a pre-defined set of sequences, with all other non-zero amplitudes that are not one considered as zero. Each sequence in the predefined set is a sequence of amplitude-1's and 0's starting and ending with a coefficient of amplitude 1. The coding is such that relatively short codewords in the bitstream represent events that are relatively more likely to occur, and relatively long codewords represent events that are relatively less likely to occur. The decoding method includes determining the mode, and then for the mode, for each codeword, determining the event represented by each codeword, and determining the sub-series of coefficients of each determined event until all coefficients in the block are determined. The decoded modes are then combined to provide the original sequence. In one version, a codeword representing an end of block is used in the coding to indicate that all remaining coefficients in the block are 0. When the decoding method encounters the codeword representing the end of block, it assigns amplitude 0 to all remaining coefficients.

How to recognize the codewords in the bitstream and how to decode the recognized codewords given a description of the encoding scheme, e.g., a coding table, is known to those in the art. In one embodiment, the codes are selected such that no codeword is the prefix of a longer codeword. The encoding method includes recognizing a codeword bit-by-bit as more data of the input bitstream is obtained. One method uses a decoding table, which is a table that provides the events for all possible codewords. As a codeword is recognized, the event of that codeword, i.e., the sequence of coefficients is formed.

One decoding method uses a lookup table. In such an embodiment, a table is provided containing a plurality of codewords and the events for each codeword. The determining of the event for each recognized codeword includes looking up the table.

Figure 5:
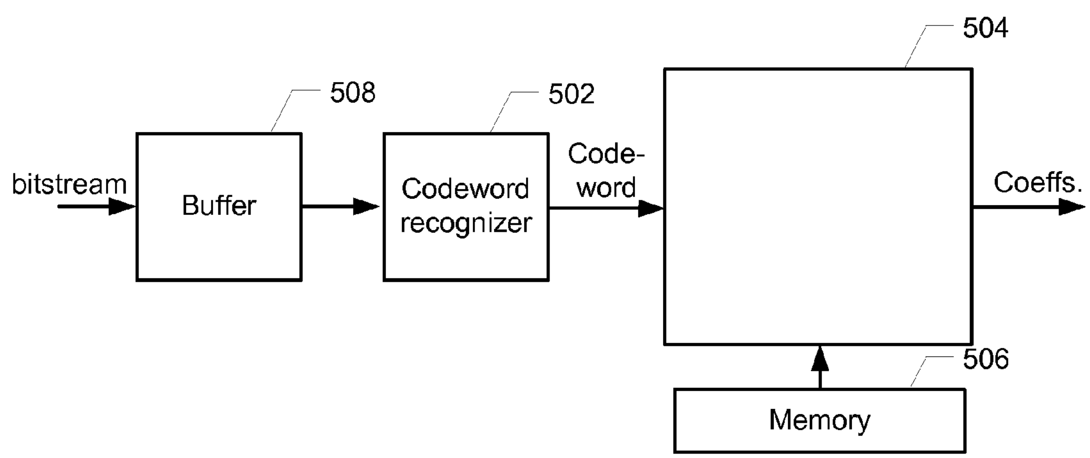
FIG. 5 shows a simplified block diagram of an embodiment of a decoding apparatus.

Another aspect of the invention is an apparatus for decoding a bitstream encoded by any of the novel methods described herein. FIG. 5 shows one embodiment of the apparatus. A codeword recognizer 502 accepts the bits of a bitstream and recognizes a codeword of a set of possible codewords that each represents an event or a mode. A decoder 504 is coupled to the codeword recognizer 502 and determines the mode or the event for the codeword recognized by the codeword recognizer. In one embodiment, the decoder 504 is a lookup device that looks up a table stored in a memory 506. That table provides the event for at least some of the codewords of the set of codewords. Other codewords may include an escape code, so that decoding is by other than a table lookup. In one embodiment, the bitstream is stored in a buffer 908, and the output of the buffer is coupled to the codeword recognizer.

While in the embodiment shown in FIG. 5, the memory is shown separate from the lookup device, those in the art will understand that in other embodiments, the memory for the table is part of the lookup device, and such other embodiments are included herein.

Another aspect of the invention is a memory (such as memory 307 in FIG. 3, memory 407 in FIG. 4, and memory 506 in FIG. 5) that stores a coding data structure that provides the codeword for an event as described any one of the novel coding methods described herein. In one embodiment, the data structure is in the form of one or more tables. For example, one memory embodiment stores a table that provides the codeword for the mode, and then includes tables for events that are for each non-zero amplitude each the length of a run of none or more zero-valued coefficients that are followed by that non-zero amplitude as if all other non-zero amplitudes are zero. There is one such table for each amplitude. In another embodiment, one of the tables defines events that are each a run of none or more zero-valued coefficients that are followed by a run of one of a predefined set of sequences, each sequence in the set being either a single coefficient of amplitude greater than one, or a sequence of 1's and 0's starting with a coefficient of amplitude 1, as if all other non-zero coefficients were zero. Relatively short codewords in the table represent events that are relatively more likely to occur, and relatively long codewords represent events that are relatively less likely to occur.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

It should further be appreciated that although the invention has been described in the context of transform encoding of images, the invention is not limited to such contexts and may be utilized in various other compression applications and systems. Furthermore, the invention is not limited to any one type of architecture or type of transform encoding. For example, the DCT is mentioned above as one transform. Other transforms may be used, e.g., the new H.264/MEG-4 part 10 AVC video coding standard/draft standard defines 4×4 blocks and a DCT-like 4×4 integer transform. The invention does not depend on any particular type of interframe coding if used, or of motion compensation if used for interframe coding, or any intra-estimation if used for estimating the pixels of a block using information from neighboring blocks.

Note that variable length coding is sometimes referred to as entropy coding or statistical coding.

Note also that the term amplitude is irrespective of sign. Therefore, for example, coefficient of values +1 and −1 both have amplitude 1.

While one embodiment described herein includes a memory that stores a coding table, other embodiments store the coding information in the form of a data structure other than a table, e.g., a structure that includes a tree. Other data structures also may be used. Similarly, while one embodiment described herein includes a memory that stores a decoding, other embodiments store the decoding information in the form of a data structure other than a table for the decoding.

Note also that the present invention does not depend on the particular type of VLC used, and can work, for example, with Huffman coding and with arithmetic coding methods. Furthermore, while embodiments have been described that used fixed encoding for the events based on assumed or a-priori likelihoods of occurrence of the events (also called the symbols), i.e., the likelihoods of occurrence of the events do not change, other embodiments use adaptive encoding, i.e., the encoding is changeable according to statistical data such as histograms collected from the actual coefficients.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

We claim:

1. A method comprising:

recognizing events corresponding to each distinct non-zero coefficient amplitude in an ordered series of quantized transform coefficients of a block of image data, an event corresponding to a particular non-zero amplitude defined by the non-zero amplitude and by the number of contiguous coefficients that precede each coefficient in the ordered series having the particular non-zero amplitude and that have other than the particular non-zero amplitude, the transform forming the coefficients such that 0 is the most likely coefficient amplitude in the series, and 1 is the next most likely coefficient amplitude in the series;

forming a codeword for each recognized event corresponding to each non-zero coefficient amplitude; and forming a codeword for each encountered non-zero coefficient amplitude in the ordered series, such that for at least some events, relatively short codewords are formed to represent events that are relatively more likely to occur.

2. A method as recited in claim 1, wherein the codewords for recognized events that correspond to each non-zero coefficient amplitude encountered in the series are formed by a corresponding one-dimensional coding table that includes at least some variable length codewords, such that the method uses a first set of corresponding one-dimensional coding tables.

3. A method as recited in claim 1, wherein the codewords for each encountered non-zero coefficient amplitude in the series are formed by a one-dimensional coding table that includes at least some variable length codewords.

4. A method as recited in claim 1, further comprising the step of encoding the formed codeword of each recognized event with an indication of the sign of the non-zero coefficients of the recognized event.

5. A method as recited in claim 1, wherein the forming of the codewords for recognized events comprises:

forming fixed length codewords for at least one of the events corresponding to at least one of the modes.

6. A method as recited in claim 1, wherein the forming of codewords for each recognized event is fixed based on assumed a-priori likelihood of occurrence of the events.

7. A method as recited in claim 1, wherein the forming of codewords for each event is changeable according to actual statistical data collected from the series of coefficients.

8. A method as recited in claim 1, further comprising:

forming an indication for when all the remaining digital signals in the series have amplitude zero.

9. An apparatus comprising:

an event recognizer operative to accept an ordered series of quantized transform coefficients of a block of image data and to recognize events corresponding to each distinct non-zero coefficient amplitude in the ordered series, an event corresponding to a particular non-zero amplitude defined by the non-zero amplitude and by the number of contiguous coefficients that precede each coefficient in the ordered series having the particular non-zero amplitude and that have other than the particular non-zero amplitude, the transform forming the coefficients such that 0 is the most likely coefficient amplitude in the series, and 1 is the next most likely coefficient amplitude in the series; and an encoder operative to form a codeword for each recognized event corresponding to each non-zero coefficient amplitude, the encoder further operative to form a codeword for each encountered non-zero coefficient amplitude in the ordered series, such that for at least some events, relatively short codewords are formed to represent events that are relatively more likely to occur.

10. An apparatus comprising:

means for recognizing events corresponding to each distinct non-zero coefficient amplitude in an ordered series of quantized transform coefficients of a block of image data, an event corresponding to a particular non-zero amplitude defined by the non-zero amplitude and by the number of contiguous coefficients that precede each coefficient in the ordered series having the particular non-zero amplitude and that have other than the particular non-zero amplitude;

means for forming a codeword for each recognized event corresponding to each non-zero coefficient amplitude; and means for forming a codeword for each encountered non-zero coefficient amplitude in the ordered series, such that for at least some events, relatively short codewords are formed to represent events that are relatively more likely to occur.

11. An apparatus as recited in claim 10, wherein the means for forming codewords for recognized events that correspond to each non-zero coefficient amplitude encountered in the series uses a corresponding one-dimensional coding table that includes at least some variable length codewords, such that the means for forming codewords for recognized events uses a first set of corresponding one-dimensional coding tables.

12. An apparatus as recited in claim 10, wherein the means for forming codewords for each encountered non-zero coefficient amplitude in the series uses a one-dimensional coding table that includes at least some variable length codewords.

13. A decoding method comprising:

accepting a bitstream in order to form a series of quantized coefficients of a transform of a block of image data, the transform such that 0 is the most likely coefficient amplitude and 1 is the next most likely coefficient amplitude, the bitstream encoded by an encoding method applied to a series of coefficients, the encoding method including:

recognizing events corresponding to each distinct non-zero coefficient amplitude in an ordered series of quantized transform coefficients of a block of image data, an event corresponding to a particular non-zero amplitude defined by the non-zero amplitude and by the number of contiguous coefficients that precede each coefficient in the ordered series having the particular non-zero amplitude and that have other than the particular non-zero amplitude, the transform forming the coefficients such that 0 is the most likely coefficient amplitude in the series, and 1 is the next most likely coefficient amplitude in the series;

forming a codeword for each recognized event corresponding to each non-zero coefficient amplitude, such that for at least some events, the encoding method forms relatively short codewords to represent events that are relatively more likely to occur; and forming a codeword for each encountered non-zero coefficient amplitude in the ordered series, the decoding method further comprising:

recognizing a codeword for corresponding to a non-zero amplitude;

recognizing a codeword for an event corresponding to the non-zero amplitude;

determining the event represented by the recognized codeword for the non-zero amplitude; and determining the sub-series of coefficients of each determined event, until all coefficients in the series are determined.

14. A method as recited in claim 13, wherein the codewords for recognized events that correspond to each non-zero coefficient amplitude encountered in the series are formed by a corresponding one-dimensional coding table that includes at least some variable length codewords, such that the method uses a first set of corresponding one-dimensional coding tables.

15. A method as recited in claim 14, wherein the codewords for each encountered non-zero coefficient amplitude in the series are formed by a one-dimensional coding table that includes at least some variable length codewords.

16. An apparatus to decode a bitstream encoded by an encoding method, the apparatus comprising:

a codeword recognizer operative to accept the bits of the bitstream and recognize a codeword of a set of possible codewords that each represent a non-zero amplitude in an ordered series of quantized transform coefficients of image data such that zero is the most likely to occur amplitude in the series, and 1 is the next most likely to occur amplitude, the codeword recognizer further operative to recognize an event for each represented non-zero amplitude, a decoder coupled to the codeword recognizer to determines the event for the codeword recognized for the non-zero amplitude by the codeword recognizer, wherein the encoding method applied to a series of coefficients includes:

recognizing events corresponding to each distinct non-zero coefficient amplitude in an ordered series of quantized transform coefficients of a block of image data, an event corresponding to a particular non-zero amplitude defined by the non-zero amplitude and by the number of contiguous coefficients that precede each coefficient in the ordered series having the particular non-zero amplitude and that have other than the particular non-zero amplitude, the transform forming the coefficients such that 0 is the most likely coefficient amplitude in the series, and 1 is the next most likely coefficient amplitude in the series;

forming a codeword for each recognized event corresponding to each non-zero coefficient amplitude; and forming a codeword for each encountered non-zero coefficient amplitude in the ordered series, such that for at least some events, the encoding method forms relatively short codewords to represent events that are relatively more likely to occur.

* * * * *